US012601773B2

(12) United States Patent
Du

(10) Patent No.: US 12,601,773 B2
(45) Date of Patent: *Apr. 14, 2026

(54) DETECTION CIRCUIT AND RELATED ELECTRONIC APPARATUS

(71) Applicant: HUIKE (SINGAPORE) HOLDING PTE.LTD., The Aries (SG)

(72) Inventor: Can Hong Du, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 216 days.

This patent is subject to a terminal disclaimer.

(21) Appl. No.: 18/453,862

(22) Filed: Aug. 22, 2023

(65) Prior Publication Data

US 2023/0393177 A1 Dec. 7, 2023

Related U.S. Application Data

(63) Continuation of application No. PCT/CN2021/122114, filed on Sep. 30, 2021.

(51) Int. Cl.
*G01R 23/16* (2006.01)
(52) U.S. Cl.
CPC ................................... *G01R 23/16* (2013.01)
(58) Field of Classification Search
CPC ......... G01R 23/16; G01R 19/04; G01R 29/02
See application file for complete search history.

(56) References Cited

U.S. PATENT DOCUMENTS

| | | | |
|---|---|---|---|
| 2003/0150977 | A1 | 8/2003 | Yamazaki et al. |
| 2008/0100280 | A1 | 5/2008 | Masson et al. |
| 2009/0302934 | A1 | 12/2009 | Costa-Domingues et al. |

(Continued)

FOREIGN PATENT DOCUMENTS

| | | |
|---|---|---|
| CN | 1947020 A | 4/2007 |
| CN | 103097994 A | 5/2013 |
| CN | 105306845 A | 2/2016 |

(Continued)

OTHER PUBLICATIONS

EPO search report dated Aug. 19, 2024 from the EP corresponding application.

(Continued)

*Primary Examiner* — Lee E Rodak
*Assistant Examiner* — Jeremiah J Barron
(74) *Attorney, Agent, or Firm* — WPAT, P.C.; Anthony King

(57) ABSTRACT

Disclosed in the present application are a detection circuit and a related electronic apparatus. A detection circuit is used for determining the amplitude of a received signal that is generated by a receiver after same receives an input signal, and includes an operational amplifier; a capacitor unit, which is coupled between an output end and a negative end of the operational amplifier; a reset switch, which is arranged in parallel with the capacitor unit; a first switch, which is coupled between a reference voltage and an output end of the receiver; and a second switch, which is coupled between the output end of the receiver and the negative end of the operational amplifier, wherein in a general stage, the received signal includes a plurality of waves with a period T.

15 Claims, 9 Drawing Sheets

(56)                References Cited

U.S. PATENT DOCUMENTS

| | | | | |
|---|---|---|---|---|
| 2015/0338952 A1* | 11/2015 | Shahparnia | ........... | G06F 3/0443 |
| | | | | 345/174 |
| 2021/0305487 A1* | 9/2021 | Li | ......................... | H10N 30/05 |

FOREIGN PATENT DOCUMENTS

| CN | 103235040 | B | 4/2016 |
|---|---|---|---|
| CN | 205486168 | U | 8/2016 |
| CN | 106775143 | A | 5/2017 |
| CN | 107615226 | A | 1/2018 |
| CN | 109074202 | A | 12/2018 |
| CN | 109587420 | A | 4/2019 |
| CN | 109643139 | A | 4/2019 |
| CN | 109787563 | A | 5/2019 |
| CN | 111095916 | A | 5/2020 |
| CN | 214173290 | U | 9/2021 |
| DE | 112022002117 | T5 | 4/2024 |
| JP | H0660686 | A | 3/1994 |
| TW | 200939098 | A | 9/2009 |

OTHER PUBLICATIONS

English abstract of CN103097994A.
English abstract of CN103235040B.
English abstract of CN106775143A.
English abstract of CN107615226A.
English abstract of CN109074202A.
English abstract of CN109643139A.
English abstract of CN214173290U.
English abstract of JPH0660689A.
English abstract of TW200939098A.
As-filed PCT Request of PCT/CN2021/122114.
International Searching Authority (ISA) Form 202—Notification of Receipt of Search Copy of PCT/CN2021/122114.
International Searching Authority (ISA) Form 210—International Search Report of PCT/CN2021/122114.
International Searching Authority (ISA) Form 220—Notification of Transmittal of the International Search Report and the Written Opinion of the International Searching Authority, or the Declaration of PCT/CN2021/122114.
International Searching Authority (ISA) Form 237—Written Opinion of PCT/CN2021/122114.
Notification of the International Application number and of the International Filing Date—Form 105 of PCT/CN2021/122114.
Publication PCT Application of PCT/CN2021/122114 published as WO 2023/050288.
As-filed PCT application of PCT/CN2021/122114.
EPO Communication under Rule 71(3) EPC dated Feb. 6, 2025 from the EP corresponding application.

* cited by examiner

DETECTION CIRCUIT AND RELATED ELECTRONIC APPARATUS

CROSS-REFERENCE TO RELATED APPLICATIONS

This application is a continuation of International Application No. PCT/CN2021/122114, filed on Sep. 30, 2021, the disclosure of which is hereby incorporated by reference in its entirety.

TECHNICAL FIELD

The present application relates to a circuit, particularly a detection circuit and a related electronic apparatus.

BACKGROUND

In modern electronic sensing technology, sinusoidal waves are commonly used as the carrier wave in detection circuits, and the purpose of measuring the variables are attained by detecting the amplitude of the sinusoidal wave. The detection of the amplitude of the sinusoidal wave requires the use of a detection circuit.

The common detection circuit is the diode detection circuit. However, its drawback is that it requires a strong input signal amplitude, making it unsuitable for detecting weak signals. Additionally, there are some existing peak detection circuits, synchronous detection circuits, phase-sensitive detection circuits, etc. in the in the industry. These detection circuits have the disadvantages of low detection sensitivity or complex circuit structures. Therefore, how to solve the above-mentioned issues has become an urgent issue in this field.

SUMMARY

One purpose of the present disclosure is to disclose a detection circuit and a related electronic apparatus to address the above-mentioned issues.

One embodiment of the present disclosure discloses a detection circuit, configured to determine the amplitude of a received signal generated by a receiver after receiving an input signal, wherein the detection circuit includes: an operational amplifier, having a positive end, a negative end and an output end; a capacitor unit, coupled between the output end of the operational amplifier and the negative end; a reset switch, arranged in parallel with the capacitor unit; a first switch, coupled between a reference voltage and the output end of the receiver; and a second switch, coupled between the output end of the receiver and the negative end of the operational amplifier, wherein: in a reset stage, the reset switch is turned on and the second switch is turned off, and the output end of the operational amplifier outputs the reference voltage; and in a general stage, the reset switch is turned off, and the received signal includes a plurality of waves with a period of T, and in a period T corresponding to a first specific wave of the plurality of waves, the detection circuit is set to a sampling mode for time period of T*R and set to a non-sampling mode for time period of T*(1−R), wherein R is greater than 0 and smaller than 1; and in a period T corresponding to a second specific wave of the plurality of waves, the detection circuit is set to the sampling mode for time period of T*R and set to the non-sampling mode for time period of T*(1−R), wherein: in the sampling mode, the first switch is turned off and the second switch is turned on, so that the amplitude change of the received signal during the sampling mode is reflected in a specific proportion and is accumulated at the output end of the operational amplifier; and in the non-sampling mode, the first switch is turned on and the second switch is turned off, so that the amplitude change of the received signal generated by the receiver in the non-sampling mode does not respond and does not accumulate at the output end of the operational amplifier, so that the voltage at the output end of the operational amplifier remains constant in the non-sampling mode.

One embodiment of the present disclosure discloses an electronic apparatus that includes the above-mentioned detection circuit.

Compared to the conventional art, the detection circuit and the related electronic apparatus according to the present disclosure can use a simple circuit to achieve high sensitivity.

DETAILED DESCRIPTION

Figure 1:
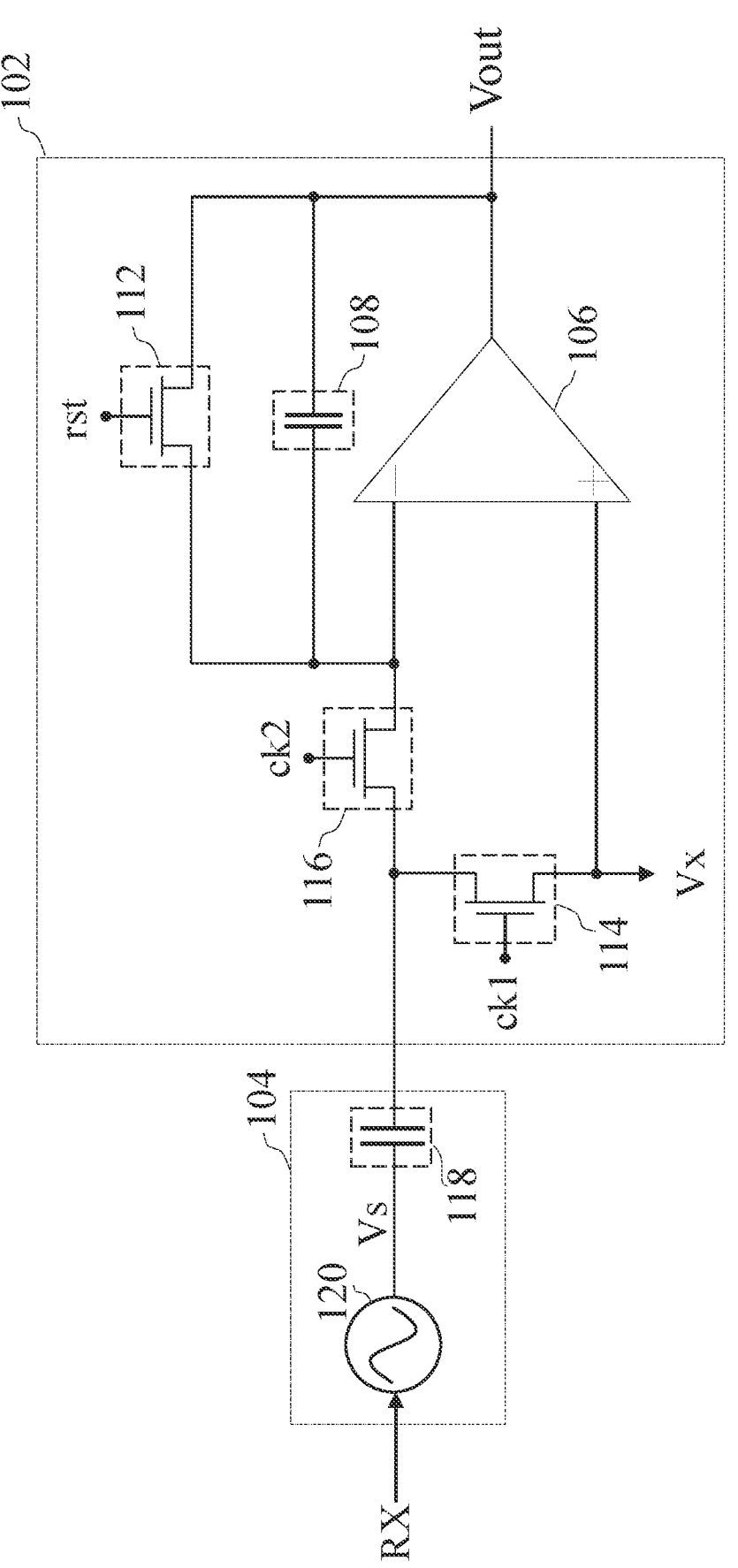
FIG. 1 is a schematic diagram illustrating a detection circuit according to a first embodiment of the present disclosure.

The present disclosure provides several different implementations or embodiments that can be used to achieve different features of the present application. For the purpose of simplicity, the present disclosure also describes examples of particular components and arrangements. I should be noted that these particular examples are provided for illustration purposes only and are not intended to be limiting in any way. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in various embodiments; this repetition is used for the purpose of simplicity and clarity and does not in itself dictate a relationship between the various embodiments and/or configurations discussed. Further, in the description that follows, the term "coupled" indicates not only that the components are directly coupled to each other, but also that the components are coupled to each other and another set of components is inserted therebetween.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or symbols in the various embodiments. This repetition is for the purpose of simplicity and clarity and does not in itself dictate a relationship between the various embodiments and/or configurations discussed.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. As could be appreciated, other than in the working examples, or unless otherwise expressly specified, all of the numerical ranges, amounts, values, and percentages (such as those for quantities of materials, duration of times, temperatures, operating conditions, portions of amounts, and the likes) disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Here, ranges can be expressed herein as from one endpoint to another endpoint or between two endpoints. All ranges disclosed herein are inclusive of the endpoints, unless specified otherwise.

FIG. 1 is a schematic diagram illustrating a detection circuit according to a first embodiment of the present disclosure. The detection circuit 102 is configured to determine the amplitude of a received signal Vs generated by the receiver 104 after the receiver 104 receives an input signal RX. The detection circuit 102 includes an operational amplifier 106, a capacitor unit 108, a reset switch 112, a first switch 114 and a second switch 116. The operational amplifier 106 has a positive end (+), a negative end (−) and an output end. The capacitor unit 108 is coupled between the output end and the negative end (−) of the operational amplifier 106. The reset switch 112 and the capacitor unit 108 are connected in parallel. The first switch 114 is coupled between the reference voltage Vx and the output end of the receiver 104. The second switch 116 is coupled between the output end of the receiver 104 and the negative end (−) of the operational amplifier 106. The positive end (+) of the operational amplifier 106 is coupled to the reference voltage Vx. The reset switch 112 is under the control of a signal rst, the first switch 114 is under the control of a signal ck1, and the second switch 116 is under the control of a signal ck2. In the present embodiment, the reset switch 112, the first switch 114 and the second switch 116 can be implemented using N-type transistors; however, the present disclosure is not limited thereto. The capacitance of the capacitor unit is CI.

The receiver 104 equivalently includes a signal generator 120 and a receiver capacitor 118. The signal generator 120 is configured to generate the received signal Vs according to the input signal RX. The receiver capacitor 118 is coupled to the signal generator 120 and configured to receive the received signal Vs. The capacitance of the receiver capacitor 118 is CS.

Figure 2:
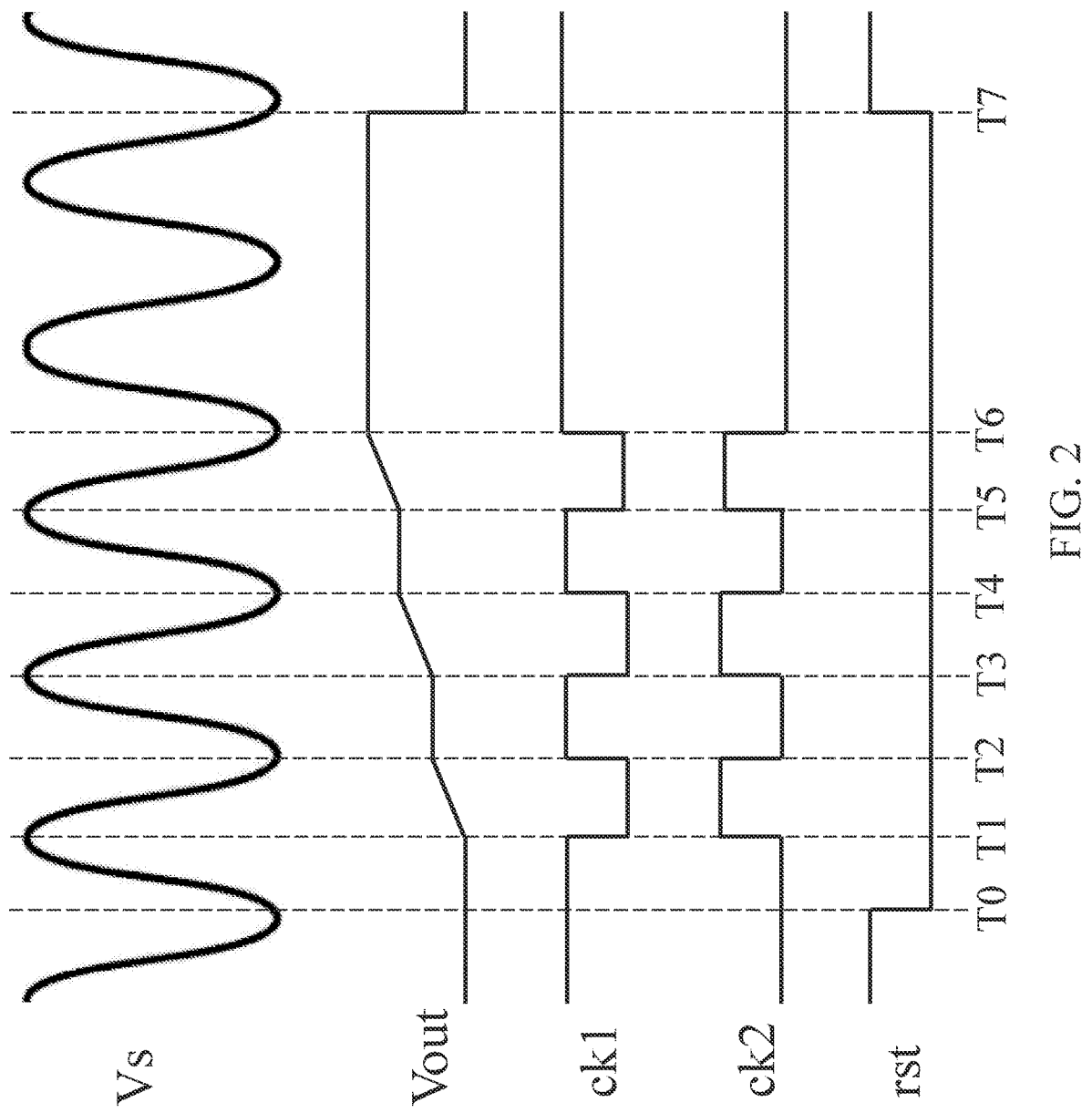
FIG. 2 is a timing diagram of a first embodiment of the detection circuit shown in FIG. 1.

Reference is also made to FIG. 2, which a timing diagram of a first embodiment of the detection circuit shown in FIG. 1. The received signal Vs includes a plurality of waves having a period of T (such as the time point T0 to the time point T2). As shown in the drawing, the received signal Vs is a sinusoidal wave. The detection circuit 102 according to the present disclosure can be configured to sample the amplitude of the received signal Vs. Since the amplitude of the received signal Vs may be quite small, in order to increase the sensitivity of the detection circuit 102, the detection circuit 102 will sample the amplitude in an integral manner for multiple periods of the received signal Vs and accumulate the results of the multiple periods of sampling. The detection circuit 102 of the present disclosure is not only applicable to the case where the received signal Vs is a sinusoidal wave. In some embodiments, the received signal Vs may also be in the form of a triangular wave or a trapezoidal wave. As long as the slope of the rising edge of the received signal Vs from the trough to the peak is less than 90 degrees, and the slope of the falling edge of the received signal Vs from the peak to the trough is greater than −90 degrees.

Before the time point T0 and after the time point T7, the detection circuit 102 enters a reset stage. In the reset stage, the signal rst is a high voltage level so as to turn on reset the switch 112, and the signal ck2 is a low voltage level, causing the second switch 116 to turn off; since the operational amplifier 106 forms a negative feedback, the output and negative (−) voltage of the operational amplifier 106 106 will be limited to the same voltage as the positive (+) voltage, i.e., the reference voltage Vx and the voltage at both ends of capacitor unit 108 is the same so that its capacitance value is cleared to zero. Furthermore, during the reset stage, the signal ck1 may be a high voltage level to turn on the first switch 114 to incidentally reset the equivalent capacitance 118 of the receiver 104.

In the general stage between the time point T0 and the time point T7, the reset switch 112 is turned off. In the operational embodiment shown in FIG. 2, the time point T0, the time point T2, the time point T4 and the time point T6 are aligned with four consecutive troughs of the received signal Vs; the time point T1, the time point T3 and the time point T5 are aligned with three consecutive peaks of the received signal Vs. In other words, the length of time from the time point T0 to the time point T2, the length of time from the time point T2 to the time point T4, and the length of time from the time point T4 to the time point T6 are all equal to the period T of the received signal Vs.

Specifically, if the amplitude of the received signal Vs is to be sampled during the general stage, the first switch 114 and the second switch 116 need to be switched on and off according to the frequency of the received signal Vs. In the operational embodiment shown in FIG. 2, at the time between the time point T1 and the time point T2, at the time between the time point T3 and the time point T4, and at the time between the time point T5 and the time point T6, the signal ck1 is a low voltage level, causing the first switch 114 to be turned off, and the signal ck2 is a high voltage level, causing the second switch 116 to be turned on, so that the detection circuit 102 enters the sampling mode. During the rest of the general stage, the first switch 114 is turned on and the second switch 116 is turned off, causing the detection circuit 102 to enter the non-sampling mode. Thus, for three consecutive periods starting at the time point T0, the detection circuit 102 is in the sampling mode for half of each period (T*0.5) and in the non-sampling mode for the other half of the period (T*0.5).

As shown in FIG. 2, in each sampling mode, the voltage change of the received signal Vs is reflected in a specific proportion and accumulates at the output end of the operational amplifier 106 and contributes to ΔVout. Taking the time between the time point T1 and the time point T2 as an example, if the amplitude of the received signal Vs is VA and the received signal Vs drops from the wave peak to the wave trough, i.e., the voltage change of the received signal Vs between the time point T1 and the time point T2 is −2*VA, then ΔVout=2*VA*CS/CI, so that the voltage Vout at the output end of the operational amplifier 106 is accumulated upward from the reference voltage Vx. Since ΔVout is proportional to the amplitude VA of the received signal Vs, the detector effect can be achieved and the voltage Vout at the output end of the operational amplifier 106 increases by ΔVout with each repetition of the sampling process, in which the sampling mode can be repeated for N periods, so that the output voltage Vout=Vx+N*Δvout accumulates and rises continuously. Multiple integrations are carried out to improve the sensitivity of the detection circuit 102. In the present embodiment, N is an integer, and in FIG. 2N is shown as 3 for illustration purpose only; the present disclosure does not limit the range of N, as long as it is an integer greater than 0. However, to reflect the advantages of the present disclosure, N can be increased, for example, in the range of 100 to 1000 orders of magnitude.

In each non-sampling mode, the voltage change of the received signal Vs is not reflected and accumulated on the output end of the operational amplifier 106, and hence, the voltage Vout at the output end of the operational amplifier 106 remain constant in the non-sampling mode. Take the time between the time point T2 and the time point T3 as an example, the received signal Vs rises from the trough to the peak, but since the first switch 114 is turned on and the second switch 116 is turned off, the voltage change 2*VA of the received signal Vs does not affect the voltage Vout at the output end of the operational amplifier 106. Therefore, the accumulated amount of the voltage Vout from the voltage change of the received signal Vs from the time point T1 to the time point T2 will not be offset.

Figure 3:
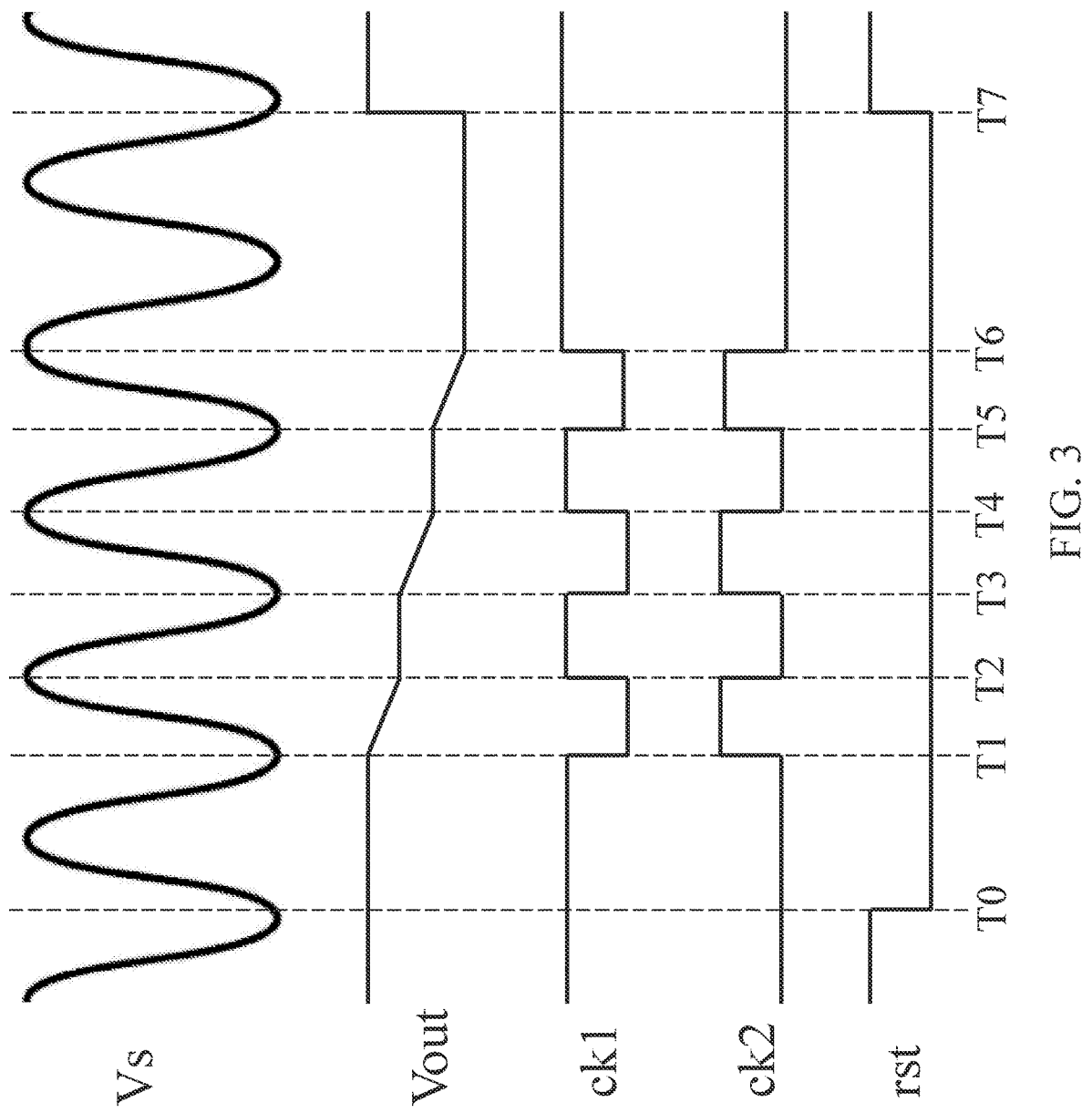
FIG. 3 is a timing diagram of a second embodiment of the detection circuit shown in FIG. 1.

Reference is made to FIG. 3, which is a timing diagram of a second embodiment of the detection circuit shown in FIG. 1. The difference between FIG. 3 and FIG. 2 lies in that, in FIG. 3, the sampling mode takes place during the time when the received signal Vs rises from the trough to the peak; i.e., in the sampling mode shown in FIG. 3, the voltage change of the received signal Vs is 2*VA, and then ΔVout=− 2*VA*CS/CI. That is, the voltage Vout at the output terminal of the operational amplifier 106 is accumulated negatively from the reference voltage Vx downward.

Figure 4:
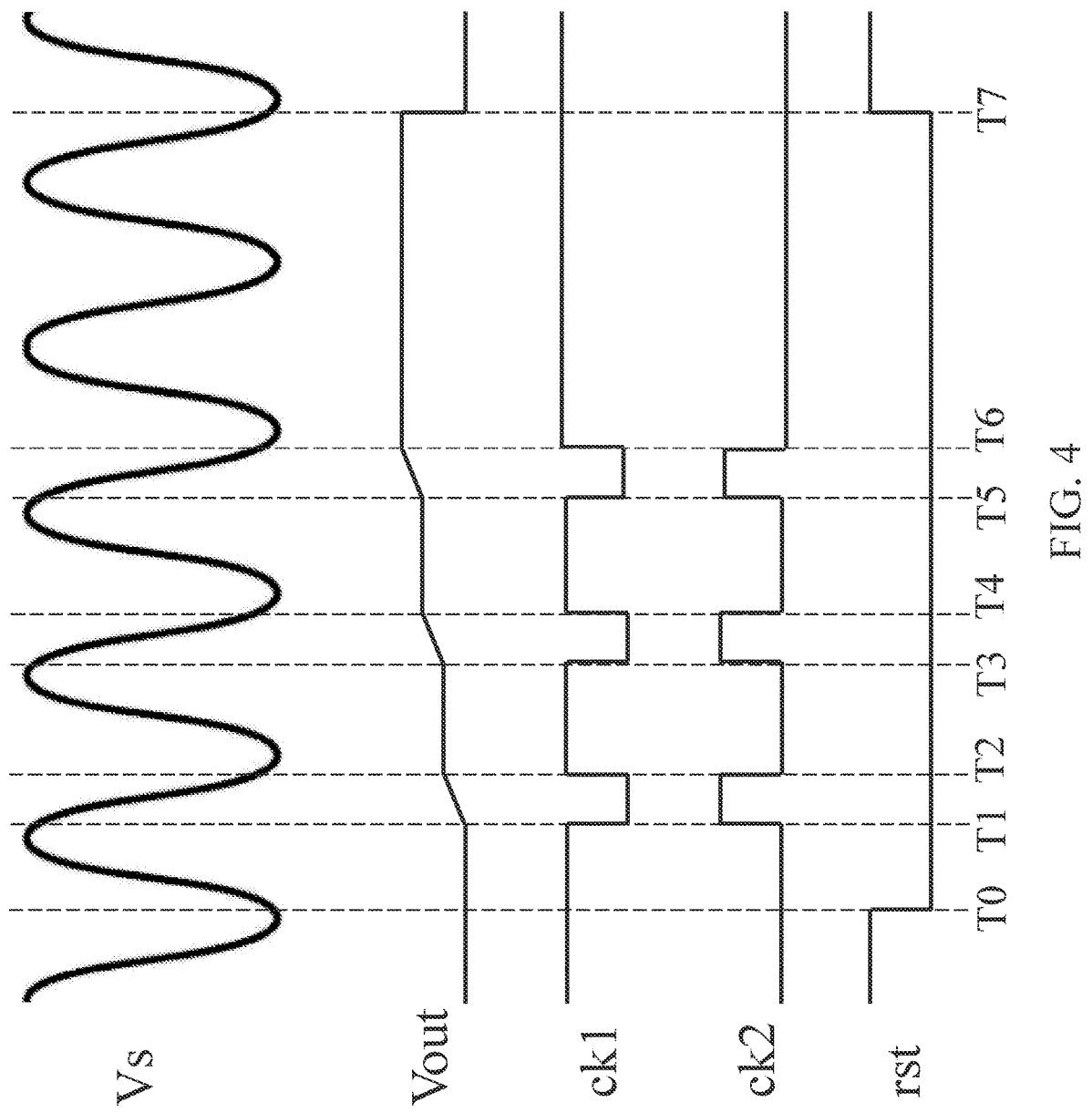
FIG. 4 is a timing diagram of a third embodiment of the detection circuit shown in FIG. 1.

Reference is made to FIG. 4, which is a timing diagram of a third embodiment of the detection circuit shown in FIG. 1. The difference between FIG. 4 and FIG. 2 lies in that, in FIG. 4, the sampling mode takes place some time after the peak of the received signal Vs and ends before the trough arrives. Therefore, for the three consecutive periods starting from the time point TO, the detection circuit 102 is in the sampling mode for less than half of the time (for example T*0.3) in each period, and the detection circuit 102 is in the non-sampling mode for more than half of the time (for example T*0.7). In this way, in the sampling mode in FIG. 4, the voltage change of the received signal Vs will no longer be −2*VA, but −2*X*VA, where the value of X is less than 1 and greater than 0, and then ΔVout=2*X*VA*C S/CI. That is, the voltage Vout at the output terminal of the operational amplifier 106 is accumulated upwards from the reference voltage Vx, but the accumulated amount is smaller than that in FIG. 2.

Figure 5:
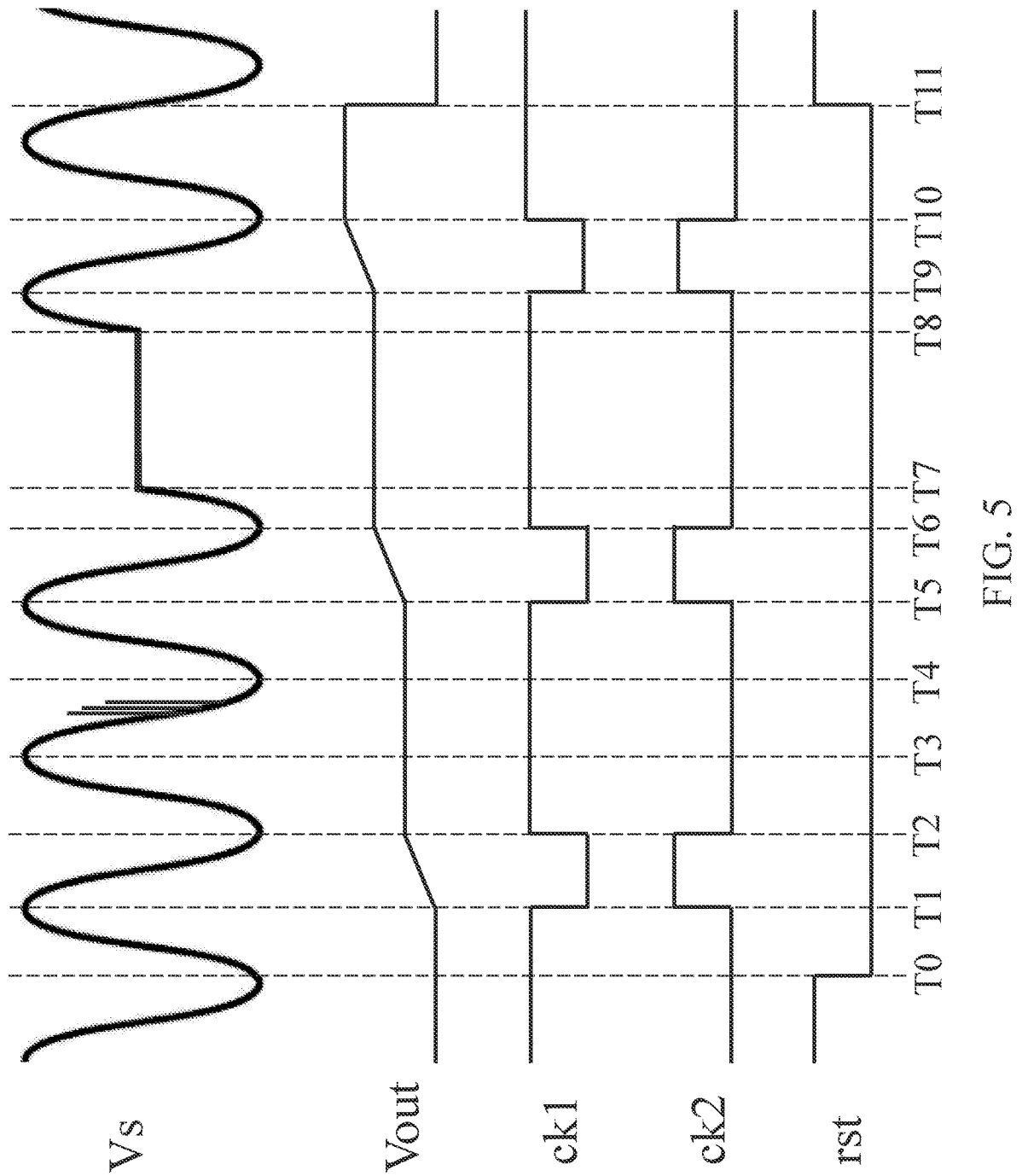
FIG. 5 is a timing diagram of a fourth embodiment of the detection circuit shown in FIG. 1.

Reference is made to FIG. 5, which is a timing diagram of a fourth embodiment of the detection circuit shown in FIG. 1. The scenario depicted in FIG. 5 illustrates the situation where it is known in advance that there will be interference or discontinuity in certain periods of the received signal Vs (for example, as shown in FIG. 5, there is interference in the received signal Vs between the time point T3 and the time point T4, and there is a discontinuity in the received signal Vs between the time point T7 and the time point T8), then the detection circuit 102 avoids entering the sampling mode when the received signal Vs experiences interference or discontinuity. Therefore, the advantage of according to the present disclosure lies in the flexible control of the detection circuit 102, which enables selective integration of the target periods for detection, and these target periods may be discontinuous, so as to improve the accuracy of the detection results. In this way, the final purpose of effectively mitigating interference and enhancing the signal-to-noise ratio of the detection results can be achieved.

Figure 6:
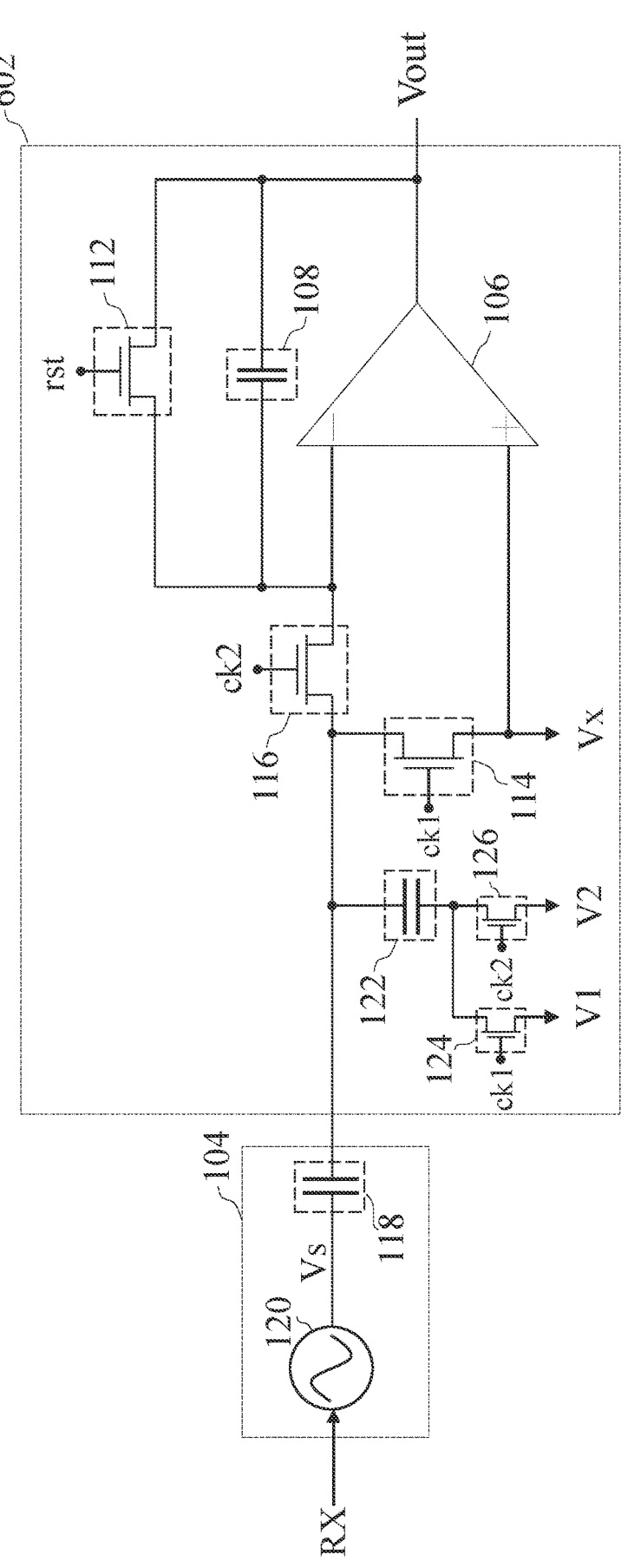
FIG. 6 is a schematic diagram illustrating a detection circuit according to a second embodiment of the present disclosure.

In some embodiments, due to non-ideal factors such as device mismatch and parasitic capacitance, the output voltage Vout of the operational amplifier 106 may have static noise, which occupies the dynamic range of the detection circuit 102. FIG. 6 illustrates a schematic diagram of a second embodiment of the detection circuit according to the present disclosure; the difference between detection circuit 602 in FIG. 6 and detection circuit 102 in FIG. 1 lies in the additional components: a calibration capacitor 122, a first calibration switch 124, and a second calibration switch 126. One end of the calibration capacitor 122 is coupled to the output end of the receiver 104. The first calibration switch 124 is coupled between the other end of the calibration capacitor 122 and the first calibration voltage V1, wherein the first calibration switch 124 is controlled by the signal ck1 so that the state of the first calibration switch 124 is synchronized with the state of the first switch 114. The second calibration switch 126 is coupled between the other end of the calibration capacitor 122 and the second calibration voltage V2, wherein the second calibration switch 126 is controlled by the signal ck2 so that the state of the second calibration switch 126 is synchronized with the state of the second switch 116. The capacitance value of the calibration capacitor 122 is CB.

In the detection circuit 602 of FIG. 6, in each sampling mode, the first calibration switch 124 and the second calibration switch 126 are controlled by the signals ck1 and ck2 and will contribute the voltage of CB/CI*(V1-V2) and accumulate it at the output end of the operational amplifier 106. By adjusting the capacitance value CB of the calibration capacitor 122, the first calibration voltage V1 and/or the second calibration voltage V2, it is possible to make the CB/CI*(V1-V2) precisely offset the value of the static noise carried by the voltage Vout at the output end of the operational amplifier 106 due to non-idealities, so that the static noise does not accumulate continuously in the plurality of sampling modes.

Figure 7:
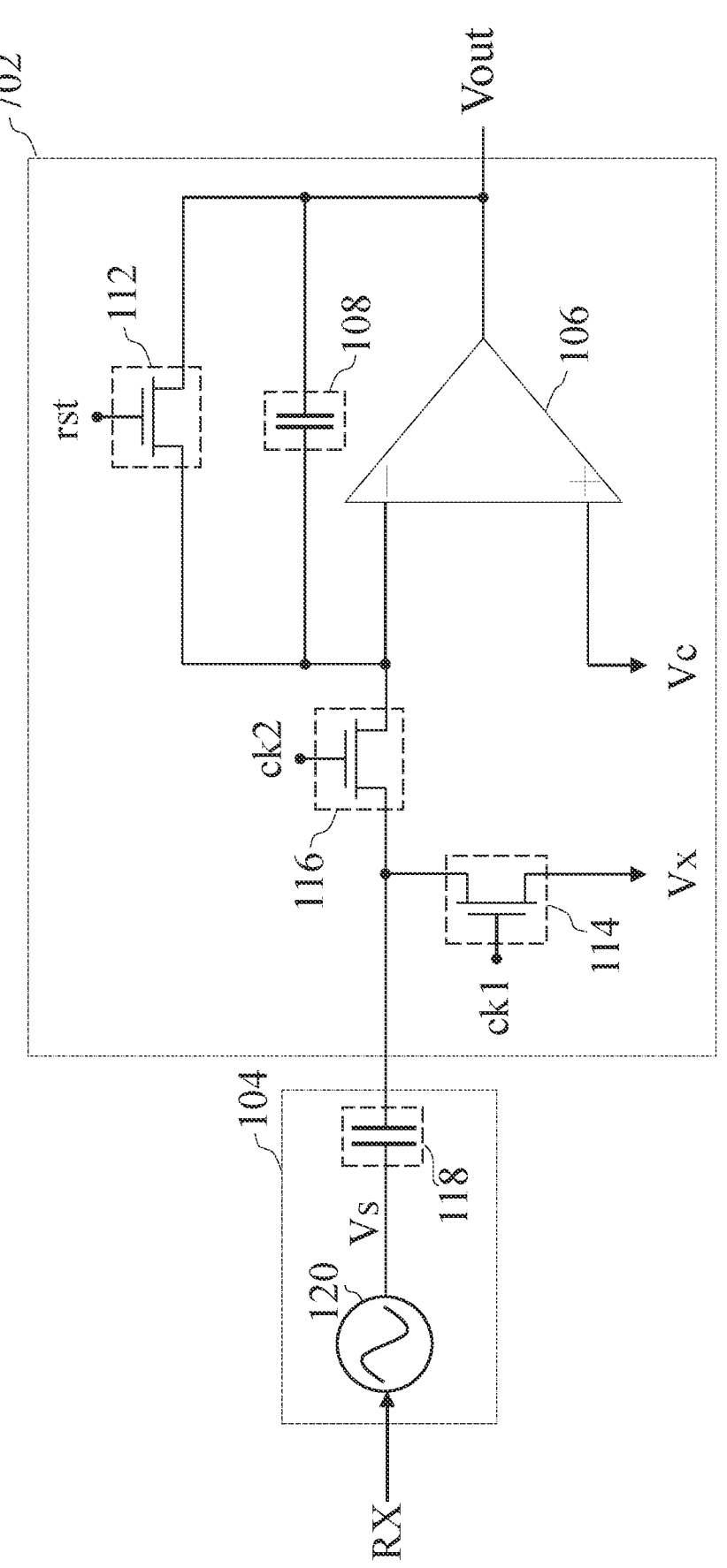
FIG. 7 is a schematic diagram illustrating a detection circuit according to a third embodiment of the present disclosure.

FIG. 7 is a schematic diagram illustrating a detection circuit according to a third embodiment of the present disclosure; the difference between the detection circuit 702 of FIG. 7 and the detection circuit 102 of FIG. 1 lies in that the positive input end (+) of the operational amplifier 106 of the detection circuit 702 of FIG. 7 is coupled to a third calibration voltage Vc. The purpose of the above variation is the same as that of the detection circuit 602 of FIG. 6, which is to offset the static noise at the output end of the operational amplifier 106 caused by the non-idealities of the voltage Vout.

Specifically, in each sampling mode, the voltage difference between the third calibration voltage Vc and the reference voltage Vx is reflected in a specific proportion and accumulates at the output end of the operational amplifier 106; i.e., it contributes a voltage of CS/CI*(Vc-Vx) and accumulates at the output end of the operational amplifier 106. By adjusting the third calibration voltage Vc, it is possible to make CS/CI*(Vc-Vx) precisely offset the value of the static noise carried by the voltage Vout at the output end of the operational amplifier 106 due to non-idealities, so that the static noise does not accumulate continuously in the plurality of sampling modes.

Figure 8:
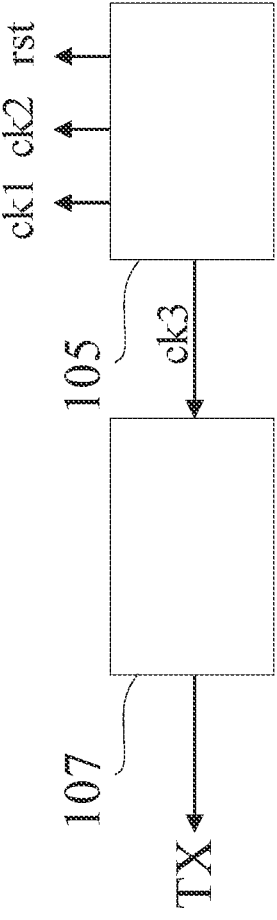
FIG. 8 is a schematic diagram illustrating a control circuit of the detection circuit according to the first embodiment of the present disclosure.

FIG. 8 is a schematic diagram illustrating a control circuit of the detection circuit according to the first embodiment of the present disclosure. The control circuit 105 can be employed in the detection circuit 102, the detection circuit 602 and/or the detection circuit 702. The control circuit 105 generates the first control signal ck1, the second control the signal ck2 and the reset the signal rst according to a reference clock (not shown in the drawing).

In the present embodiment, the control circuit 105 is further configured to generate a third control signal ck3 to control the transmitter 107 to generate an output signal TX, wherein the third control signal ck3 is periodic and has a period of T, wherein the output signal TX passes through a channel and becomes the input signal RX before entering the receiver 104.

In certain embodiments, the transmitter 107 can be a first transducer, and the receiver 104 can be a second transducer. A transducer is a device that converts one form of energy into another form. These forms of energy may include electrical, mechanical, electromagnetic, optical, chemical, acoustic and thermal energy, etc., which are not limited in the present disclosure, and the transducer may include any device capable of converting energy.

The first transducer and the second transducer may be used in a flow meter to sense the flow rate and/or flow velocity of a gas and/or liquid. By way of example, the first transducer and the second transducer may be mounted in a pipeline and the emission direction of the first transducer faces the second transducer. The distance between the first transducer and the second transducer is L, and L is greater than zero. A fluid (e.g. a liquid or a gas) having a flow velocity v flows sequentially through the first transducer and the second transducer in the direction in which the pipeline is set.

The output signal TX of the first transducer, after passing through the fluid with a flow velocity v and being reflected by the wall of the pipeline, becomes the input signal RX and is received by the second transducer and converted into the received signal Vs. The detection circuit 102, detection circuit 602 and/or detection circuit 702 of the present disclosure can sample the amplitude of the received signal Vs several times in multiple sampling modes and accumulate the sampling results. The detailed operation is as previously described.

Figure 9:
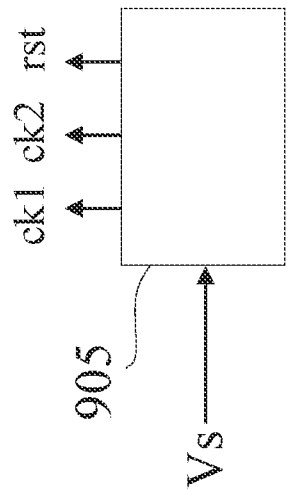
FIG. 9 is a schematic diagram illustrating a control circuit of the detection circuit according to the second embodiment of the present disclosure.

FIG. 9 is a schematic diagram illustrating a control circuit of the detection circuit according to the second embodiment of the present disclosure. The control circuit 905 differs from the control circuit 105 in FIG. 8 lies in that the control circuit 905 generates the first control signal ck1, the second control the signal ck2 and the reset the signal rst according to the received signal Vs. The control circuit 905 can be employed in the detection circuit 102, the detection circuit 602 and/or the detection circuit 702. As can be seen from the above description, the control circuit 105 is applied to a system that can control both the transmitter and the receiver; the control circuit 905 is applied to a system that simply controls the receiver, where the first control signal ck1, the second control signal ck2, and the reset signal rst need to be generated based on the received signal Vs because the information of the transmitter cannot be predicted.

In the present disclosure, the alignment of the peaks and troughs of the first control signal ck1, the second control signal ck2, and the received signal Vs can be obtained statistically, whether in the controller configuration method of FIG. 8 or FIG. 9. For example, for a plurality of different phases of the first control signal ck1 and the second control signal ck2, the amplitude of the received signal Vs is sampled and the phase that results in the most significant accumulation of the voltage Vout at the output end of the operational amplifier 106 is identified as the best phase.

The present disclosure also proposes an electronic device including a detector circuit 102, a detector circuit 602 and/or a detector circuit 702. Specifically, the electronic device includes, but is not limited to, a mobile communication device, an ultra-mobile personal computer device, a portable entertainment device, and other electronic devices having a data interaction function. Mobile communication devices are characterized by mobile communication functions and have the primary goal of providing voice and data communication. Such terminals include: smartphones (e.g., iPhone), multimedia phones, functional phones, and low-end cell phones. Ultra-mobile personal computer devices belong to the category of personal computers, which have computing and processing functions and generally also have mobile Internet access characteristics. Such terminals include: PDAs, MIDs and UMPC devices, such as iPads. Portable entertainment devices can display and play multimedia content. Devices in this category include: audio and video players (e.g. iPod), handheld game consoles, e-books, and smart toys and portable car navigation devices.

The foregoing outlines features of several embodiments of the present application so that persons having ordinary skill in the art may better understand the various aspects of the present disclosure. Persons having ordinary skill in the art should appreciate that they may readily use the present disclosure as a basis for designing or modifying other processes and structures for carrying out the same purposes and/or achieving the same advantages of the embodiments introduced herein. Persons having ordinary skill in the art should also realize that such equivalent constructions do not depart from the spirit and scope of the present disclosure, and that they may make various changes, substitutions, and alternations herein without departing from the spirit and scope of the present disclosure.

What is claimed is:

1. A detection circuit, configured to determine an amplitude of a received signal generated by a receiver after the receiver receives an input signal, wherein the detection circuit comprises:

an operational amplifier, having a positive end, a negative end and an output end;

a capacitor unit, coupled between the output end and the negative end of the operational amplifier;

a reset switch, arranged in parallel with the capacitor unit;

a first switch, coupled between a reference voltage and an output end of the receiver; and a second switch, coupled between the output end of the receiver and the negative end of the operational amplifier;

wherein:

in a reset stage, the reset switch is turned on and the second switch is turned off, the output end of the operational amplifier outputs the reference voltage; and in a general stage, the reset switch is turned off, and the received signal comprises a plurality of waves with a period of T, and in a period T corresponding to a first specific wave of the plurality of waves, the detection circuit is set to a sampling mode for time period of T*R and set to a non-sampling mode for time period of T*(1−R), wherein R is greater than 0 and smaller than 1; and in a period T corresponding to a second specific wave of the plurality of waves, the detection circuit is set to the sampling mode for a time period of T*R and set to the non-sampling mode for a time period of T*(1−R), wherein:

in the sampling mode, the first switch is turned off and the second switch is turned on, so that the amplitude change of the received signal during the sampling mode is reflected in a specific proportion and is accumulated at the output end of the operational amplifier; and in the non-sampling mode, the first switch is turned on and the second switch is turned off, so that the amplitude change of the received signal generated by the receiver in the non-sampling mode does not respond and does not accumulate at the output end of the operational amplifier, so that the voltage at the output end of the operational amplifier remains constant in the non-sampling mode.

2. The detection circuit according to claim 1, wherein the receiver equivalently includes:

a signal generator, configured to generate the received signal according to the input signal; and a receiver capacitor, coupled to the signal generator and configured to receive the received signal, wherein the capacitance of the capacitor unit is CI, and the capacitance of the receiver capacitor is CS.

3. The detection circuit according to claim 2, wherein R is 1/2, and:

the detection circuit is set to the sampling mode during the time period of T/2 when the first specific wave drops from its peak to its trough;

the detection circuit is set to the non-sampling mode during the time period of T/2 when the first specific wave rises from its trough to its peak;

the detection circuit is set to the sampling mode during the time period of T/2 when the second specific wave drops from its peak to its trough; and the detection circuit is set to the non-sampling mode during the time period of T/2 when the second specific wave rises from its trough to its peak.

4. The detection circuit according to claim 3, wherein the voltage difference between the peak and trough of the first specific wave is 2*VA, and the first specific wave drops from the peak to the trough, so that the voltage of the output end of the operational amplifier increases by 2*VA*CS/CI.

5. The detection circuit according to claim 2, wherein R is 1/2, and:

the detection circuit is set to the sampling mode during the time period of T/2 when the first specific wave rises from its trough to its peak;

the detection circuit is set to the non-sampling mode during the time period of T/2 when the first specific wave drops from its peak to its trough;

the detection circuit is set to the sampling mode during the time period of T/2 when the second specific wave rises from its trough to its peak; and the detection circuit is set to the non-sampling mode during the time period of T/2 when the second specific wave drops from its peak to its trough.

6. The detection circuit according to claim 5, wherein voltage difference between the peak and trough of the first specific wave is 2*VA, and the first specific wave rises from the trough to that peak, so that the voltage of the output end of the operational amplifier decreases by 2*VA*CS/CI.

7. The detection circuit according to claim 1, wherein in the general stage, in a period T corresponding to a third specific wave of the plurality of waves, the detection circuit is set to the non-sampling mode for whole period T, wherein the third specific waves is between the first specific wave and the second specific wave.

8. The detection circuit according to claim 1, wherein the positive end of the operational amplifier is coupled to the reference voltage.

9. The detection circuit according to claim 8, wherein the detection circuit further includes:

a calibration capacitor, having one end coupled to the output end of the receiver;

a first calibration switch, coupled between the other end of the calibration capacitor and a first calibration voltage, wherein a conduction state of the first calibration switch is synchronized with the first switch; and a second calibration switch, coupled between said the other end of the calibration capacitor and a second calibration voltage, wherein a conduction state of the second calibration switch is synchronized with the second switch.

10. The detection circuit according to claim 1, wherein the positive end of the operational amplifier is coupled to a third calibration voltage.

11. The detection circuit according to claim 1, wherein the received signal includes a plurality of sinusoidal waves or triangular waves having a period of T.

12. The detection circuit according to claim 1, further comprising:

a control circuit, configured to generate the followings according to a reference clock:

a first control signal to control the first switch;

a second control signal to control the second switch;

a reset signal to control the reset switch; and a third control signal to control a transmitter to generate an output signal, wherein the third control signal is periodic and has a period of T, wherein the output signal passes through a channel and then becomes the input signal that enters the receiver.

13. The detection circuit according to claim 12, wherein the transmitter includes a first transducer, and the receiver includes a second transducer.

14. The detection circuit according to claim 1, further comprising:

a control circuit, configured to generate the followings according to the received signal:

a first control signal to control the first switch;

a second control signal to control the second switch; and a reset signal to control the reset switch.

15. An electronic apparatus, comprising:

the detection circuit according to claim 1.

* * * * *